United States Patent [19]

Mequio

[11] Patent Number: 4,771,205

[45] Date of Patent: Sep. 13, 1988

[54] ULTRASOUND TRANSDUCER

[75] Inventor: Claude R. Mequio, Villejuif, France

[73] Assignee: U.S. Phillips Corporation, New York, N.Y.

[21] Appl. No.: 644,161

[22] Filed: Aug. 24, 1984

[30] Foreign Application Priority Data

Aug. 31, 1983 [FR] France ............................... 83 13986

[51] Int. Cl.[4] ............................................ H01L 41/08

[52] U.S. Cl. .................................... 310/334; 310/327

[58] Field of Search ................ 310/326, 327, 334–337; 367/150–152, 162

[56] References Cited

U.S. PATENT DOCUMENTS

| | | | |
|---|---|---|---|
| 2,427,348 | 9/1947 | Bond et al. | 310/326 X |
| 3,946,149 | 3/1976 | White | 310/327 X |
| 4,166,967 | 9/1979 | Benes | 310/326 X |
| 4,297,607 | 10/1981 | Lynnworth et al. | 310/327 X |
| 4,383,194 | 5/1983 | Ohigashi et al. | 310/327 X |
| 4,434,384 | 2/1984 | Dunnrowicz et al. | 310/327 X |
| 4,507,582 | 3/1985 | Glenn | 310/327 |

*Primary Examiner*—Mark O. Budd

*Attorney, Agent, or Firm*—Jack E. Haken

[57] ABSTRACT

An ultrasound transducer, comprising a substrate (10) which forms a backing medium, a layer of piezoelectric material (20), and one or more matching layers (30, 40) whose acoustic impedance has a value between that of the piezoelectric material and that of a foremost, propagation medium (50). The matching layer (layers) is (are) provided exclusively between the piezoelectric material (20) and the foremost, propagation medium (50). The acoustic impedance of the backing medium (10) is sufficiently high with respect to the acoustic impedance of the piezoelectric material for the backing medium to be considered to be rigid, the thickness of the layer of piezoelectric material (20) being equal to one quarter of the wavelength associated with the resonant frequency of the transducer.

2 Claims, 1 Drawing Sheet

FIG.1
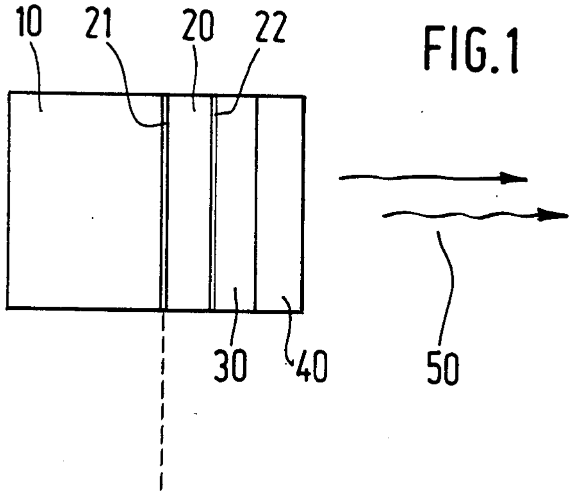
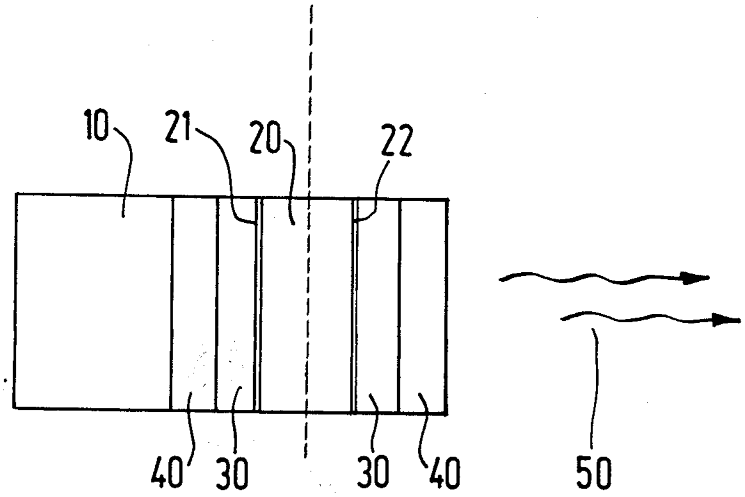
FIG.2

ULTRASOUND TRANSDUCER

The invention relates to an ultrasound transducer, comprising a substrate which forms a backing medium, a layer of piezoelectric material and one or more matching layers whose acoustic impedance has a value between that of the piezoelectric material and that of a foremost, propagation medium.

An ultrasound transducer is known to consist mainly of a substrate which forms a backing, absorption or reflection medium, a layer of piezoelectric material which is provided with electrodes on its front and rear, and at least one layer for acoustic impedance matching which is provided in front of the piezoelectric material, that is to say between this piezoelectric material and the propagation medium. Transducers of this kind are described notably in the article "The effects of backing and matching on the performance of piezoelectric ceramic transducers", published in IEEE Transactions on sonics and ultrasonics, Vol. SU-13, March 1966, pp 20–30. The main result of the provision of one or more of such matching layers is that the sensitivity of the transducers is improved and that also their bandwidth is increased.

However, it is to be noted that ultrasound transducers used for echography should combine two principal properties: not only a high sensitivity (because a higher signal-to-noise ratio facilitates the processing of the signals received), but also adequate damping (because the brevity of the pulse response determines the axial resolution).

It is the object of the invention to provide an ultrasound transducer which makes the requirements as regards sensitivity and damping compatible in a simple manner.

To this end, a first embodiment of the ultrasound transducer in accordance with the invention is characterized in that the matching layer (layers) is (are) provided between the piezoelectric material and the foremost, propagation medium, the backing medium having an acoustic impedance which is sufficiently high with respect to the acoustic impedance of the piezoelectric material (i.e. a factor of 10 between these two acoustic impedances constitutes a very good criterion) for the backing medium to be considered to be rigid (i.e. with zero deformation), the thickness of the layer of piezoelectric material being equal to one quarter of the wavelength associated with the resonant frequency of the transducer.

A second embodiment of the ultrasound transducer in accordance with the invention is characterized in that an equal number of matching layers is provided on both sides of the piezoelectric material, the pair-wise symmetrically situated layers having the same acoustic impedance and the same thickness, the backing medium having an acoustic impedance which is substantially equal to the acoustic impedance of the foremost, propagation medium, the thickness of the layer of piezoelectric material being equal to one half of the wavelength associated with the resonant frequency of the transducer, so that the transducer is symmetrical with respect to the central plane of the layer of piezoelectric material.

The features and advantages of the invention will be described hereinafter, by way of example, with reference to the FIGS. 1 and 2 which show two embodiments of transducers in accordance with the invention.

The embodiment shown in FIG. 1 consists of an ultrasound transducer which vibrates in the thickness mode and which comprises a substrate 10 which forms the backing medium of the transducer, a layer of piezoelectric material 20 whose front and rear are covered with metal foils 21 and 22 which form first and second electrodes (connected in known manner) to a polarization circuit (not shown) which supplies the excitation potential, and two acoustic impedance matching layers 30 and 40 which are situated between the piezoelectric layer and a foremost, propagation medium 50 and which are also referred to as quarterwave interference layers.

In combination with the layer 20 of piezoelectric material, the substrate 10 in this first structure in accordance with the invention has a substantially higher acoustic impedance which is in any case sufficiently high for the substrate to be considered to be rigid with respect to the piezoelectric material, that is to say as a backing medium with zero deformation. Moreover, the thickness of the layer 20 is equal to one quarter of the wavelength associated with the resonant frequency of the transducer. Finally, in order to optimize the transfer of energy from the layer of piezoelectric material 20 to the foremost, propagation medium 50, the values of the acoustic impedances of this layer, the matching layers 30 and 40 and the propagation medium should for a descending progression in this sequence, for example an arithmetical or geometrical progression.

The fact that the described first structure has a high sensitivity as well as excellent damping will be illustrated on the basis of a second, fully symmetrical ultrasound transducer (see FIG. 2) which comprises a substrate 10 which acts as the backing medium, a layer of piezoelectric material 20 which has a thickness which is equal to one half of the wavelength associated with the resonant frequency of the transducer, and two groups of two acoustic impedance matching layers 30 and 40, one of which is situated between the backing medium and the piezoelectric material whilst the other group of matchings layers is situated between the piezoelectric material and the foremost, propagation medium 50. The acoustic impedances in this second structure again form a descending progression as from the piezoelectric material, said impedances and the thicknesses of the matching layers 30 and 40 being symmetrical on both sides of the piezoelectric material. Tests and simulations performed with such a structure have demonstrated that the spectrum (or the modulus of the Fourier transform) of the echographic response on a plane steel block to a pulsed resonant electrical excitation (rectangular electric impulse of width equal to the time of fligth $\tau$, i.e. the transit time of the ultrasonic waves from one electrode to the other in the piezoelectric material) is shaped as a gaussian curve; consequently, the envelope of the electrical response is also shaped as a gaussian curve and this response will be quickly damped. Moreover, due to the symmetry of the structure, the deformation on both sides of the piezoelectric material will be the same (because both sides are acoustically loaded in the same way) so that the deformation in the central plane of this material equals zero. The part of the second structure which is situated to one side of the central plane is thus equivalent to an infinitely rigid backing medium, i.e. a backing medium with zero deformation. Such a medium can be readily manufactured when the piezoelectric material used does not have an excessively high acoustic impedance; this is why the first structure is proposed, i.e. a structure with so-called virtual symmetry comprising a rigid backing medium, a piezoelectric layer having a thickness of one quarter wavelength, and the acoustic impedance matching layers, said structure having the same damping properties as the fully symmetrical second structure and a higher sensitivity.

Tests or simulations performed in the same electrical transmission and reception circumstances have demonstrated that it is indeed possible to obtain various structure which meet the object of the invention (high sensitivity as well as suitable damping). For the case where the piezoelectric material is a ferroelectric ceramic material of the type PZT-5 (piezoelectric material containing lead zirconate-titanate, see the article "Physical Acoustics, Principles and Methods", by Warren P. Mason, Vol. 1, part A, page 202), the following examples can be mentioned (examples comprising two acoustic impedance matching layers):

(1) first structure (with virtual symmetry)
  (a) impedances(in kg/m$^2$.sx $10^6$):
    backing medium: 1000 (simulation)
    piezoelectric material: 30
    first matching layer: 4
    second matching layer: 1.8
    foremost propagation medium: 1.5
  (b) results obtained:
    sensitivity index = −10.03 dB
    bandwidth for −6 dB=55%
    response time to −10 dB=7.6 $\tau$
    response time to −40 dB=8.9 $\tau$ It is to be noted that the sensitivity is characterized by a sensitivity index whose value in dB equals 20 log $V_S/V_{REF}$, in which $V_{REF}$ is the amplitude of the resonant impulse delivered by the generator only loaded by an impedance equal to its output impedance, and in which $V_S$ is the peak-to-peak voltage of the response; the damping is generally characterized by the relative bandwidth $\Delta f/f$ at −6 dB, expressed in %, of the basic spectrum; therein $\Delta f$ is the distance between the points where the amplitude of the basic spectrum is 6 dB below its maximum value and f is the central frequency. The latter information, however, is insufficient for fully characterizing the damping, because the shape of the basic spectrum which may be irregular and the presence of higher harmonics which disturb the ends of the echos have not been taken into account. This information is supplemented by two further time indicators, i.e. the response times up to −20 dB and up to −40 dB. These response times are standardized, i.e. expressed in said time of flight $\tau$. The response times up to −20 dB and −40 dB are times which expire until the peak-to-peak voltage has decreased to one tenth and one hundredth, respectively, of its maximum value.

(2) second structure with full symmetry, exchangeable against the preceding structure:
  (a) impedances
    backing medium: 1.5
    matching layers: 1.8 and 4
    piezoelectric material: 30
    matching layers: 4 and 1.8
    foremost propagation medium: 1.5
  (b) results obtained:
    sensitivity index = −13 dB
    bandwidth at −6 dB=53%
    response time up to −20 dB=7.79 $\tau$
    response time up to −40 dB=9.8 $\tau$ When the piezoelectric material is polyvinylidene fluoride, the following examples can be given (examples with one acoustic impedance matching layer):

(3) first structure (with virtual symmetry):
  (a) impedances
    backing medium: 46
    piezoelectric material: 4.6
    matching layer: 1.8
    foremost propagation medium: 1.5
  (b) results obtained:
    sensitivity index = −19.66 dB
    bandwidth at −6 dB=82%
    response time up to −20 dB=5.4 $\tau$
    response time up to −40 dB=7.8 $\tau$ (4) second structure with full symmetry, exchangeable against the foregoing:
  (a) impedances
    foremost and backing medium: 1.5
    foremost and rearmost matching layers: 1.8
    piezoelectric material: 4.6
  (b) results obtained:
    senstivity index = −23.8 dB
    bandwidth at −6 dB=75%
    response time up to −20 dB=5.63 $\tau$
    response time up to −40 dB=8. $\tau$ The essential characteristic of the structure with full symmetry (FIG. 2) is the very high damping. The advantages of the structure with virtual symmetry (FIG. 2) are: a gain of maximum 6 dB with respect to the sensitivity index of the structure with full symmetry because of the "acoustic mirror" effect of the rigid backing medium which reflects all acoustic energy forwards, saving of the same, very good damping as that obtained in the structure with full symmetry, only half the thickness of the piezoelectric material for a given operating frequency in comparison with transducers comprising a $\lambda/2$ piezoelectric layer (the latter property is important for piezoelectric polymers such as the described polyvinylidene-fluoride which are difficult to obtain in large thicknesses). It will be apparent that the invention is not restricted to the described embodiments; within the scope of the invention many alternatives are feasible, notably alternatives utilizing a different number of layers for acoustic impedance matching between the piezoelectric material and the media at the extremities.

What is claimed is:

1. An ultrasound transducer for producing and/or detecting ultrasound energy in an adjacent propagation medium comprising:

a layer of piezoelectric material, having a front surface through which ultrasound is transferred to and/or from the propagation medium and an opposite parallel rear surface, the thickness of said layer, between said front surfaces and said rear surface being one-half wavelength at the operating frequency of the transducer;

backing means, disposed over the rear surface of the piezoelectric material, the acoustic impedance of the backing means being equal to the acoustic impedance of the propagation medium; and a pair of first matching layers which are symmetrically disposed with respect to the piezoelectric material with a front first matching layer disposed between the front surfaces and the propagation medium and a rear first matching layer disposed between the rear surface and the backing means, the acoustic impedance of the first matching layers being less than the acoustic impedance of the piezoelectric material and greater than the acoustic impedance of the propagation medium.

2. The transducer of claim 1 further comprising one or more additional pairs of matching layers, each additional pair of matching layers being symmetrically disposed with respect to the piezoelectric material so that a front layer in each additional pair lies between the front first matching layer and the propagation medium and a rear layer in each of said pairs lies between the rear first matching layer and the backing means wherein the acoustic impedance of each additional matching layer is less than the acoustic impedance of the first matching layers and greater than the acoustic impedance of the propagation medium and the successive layers form descending progressions of acoustic impedances from the piezoelectric material to the propagation medium and from the piezoelectric material to the backing means.

* * * * *